United States Patent
Tamura et al.

(10) Patent No.: US 9,587,798 B2
(45) Date of Patent: Mar. 7, 2017

(54) LIGHT SOURCE DEVICE

(71) Applicant: OLYMPUS CORPORATION, Tokyo (JP)

(72) Inventors: Kazuaki Tamura, Tokyo (JP); Eiji Yamamoto, Tokyo (JP); Takeshi Ito, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 457 days.

(21) Appl. No.: 14/166,339

(22) Filed: Jan. 28, 2014

(65) Prior Publication Data

US 2014/0140059 A1 May 22, 2014

Related U.S. Application Data

(63) Continuation of application No. PCT/JP2012/068960, filed on Jul. 26, 2012.

(30) Foreign Application Priority Data

Jul. 28, 2011 (JP) ................. 2011-165877

(51) Int. Cl.
*F21V 5/00* (2015.01)
*F21V 9/08* (2006.01)
(Continued)

(52) U.S. Cl.
CPC ................ *F21V 9/08* (2013.01); *H01S 5/005* (2013.01); *F21Y 2113/13* (2016.08);
(Continued)

(58) Field of Classification Search
CPC ....... A61B 1/07; A61B 1/0653; A61B 1/0661; G02B 23/2469; F21V 9/16
(Continued)

(56) References Cited

U.S. PATENT DOCUMENTS 5,535,230 A 7/1996 Abe
6,459,919 B1 * 10/2002 Lys ..................... A61N 5/0616
362/234

(Continued)

FOREIGN PATENT DOCUMENTS

EP 2 130 484 A1 12/2009
EP 2 283 769 A1 2/2011
(Continued)

OTHER PUBLICATIONS

Extended Supplementary European Search Report dated Jul. 3, 2015 from related European Application No. 12 81 7444.8.
(Continued)

*Primary Examiner* — William Carter
(74) *Attorney, Agent, or Firm* — Scully, Scott, Murphy & Presser, P.C.

(57) ABSTRACT

A light source device having a wavelength converting unit having a first wavelength converting member for absorbing a first excitation light having a first wavelength range, and emitting a first wavelength-converted light; and a second wavelength converting member for absorbing a second excitation light having a second wavelength range, and emitting a second wavelength-converted light, wherein the wavelength converting unit emits a first emission light having a first spectral shape when irradiated with the first excitation light, and emits a second emission light having a second spectral shape when irradiated with the second excitation light, and wherein at least a portion of the first wavelength converting member and at least a portion of the second wavelength converting members are arranged within an irradiation space that is commonly irradiated by both the first excitation light and the second excitation light.

17 Claims, 7 Drawing Sheets

(51) Int. Cl.
  *H01S 5/00* (2006.01)
  *H01S 5/40* (2006.01)
  *H01S 5/06* (2006.01)
  *H01S 5/062* (2006.01)

(52) U.S. Cl.
  CPC ........... *F21Y 2115/10* (2016.08); *H01S 5/062* (2013.01); *H01S 5/0617* (2013.01); *H01S 5/4087* (2013.01)

(58) Field of Classification Search
  USPC ........................................................ 362/574
  See application file for complete search history.

(56) References Cited

U.S. PATENT DOCUMENTS

| | | | |
|---|---|---|---|
| 2007/0189352 A1 | 8/2007 | Nagahama et al. | |
| 2009/0167149 A1* | 7/2009 | Ito | A61B 1/0638 313/501 |

FOREIGN PATENT DOCUMENTS

| | | |
|---|---|---|
| JP | 2004-071357 A | 3/2004 |
| JP | 2007-258019 A | 10/2007 |
| JP | 2009-277734 A | 11/2009 |
| JP | 2010-121068 A | 6/2010 |

OTHER PUBLICATIONS

International Preliminary Report on Patentability together with the Written Opinion dated Feb. 6, 2014 received in related International Application No. PCT/JP2012/068960.

International Search Report dated Oct. 30, 2012 in corresponding International Patent Application No. PCT/JP2012/068960.

Japanese Office Action dated Mar. 31, 2015 from Japanese Application No. 2011-165877, together with an English language translation.

* cited by examiner

WAVELENGTH (nm)

LIGHT SOURCE DEVICE

CROSS-REFERENCE TO RELATED APPLICATIONS

This application is a continuation of PCT International Application No. PCT/JP2012/068960, filed on Jul. 26, 2012, which claims the benefit of priority from Japanese Patent Application No. 2011-165877, filed on Jul. 28, 2011. The contents of PCT International Application No. PCT/JP2012/068960 and Japanese Patent Application No. 2011-165877 are incorporated herein by reference.

BACKGROUND OF THE INVENTION

The present invention relates to a light source device. A light source device is currently under development, in which light from a small solid-state light source is guided through optical fiber to a light converting member placed at an end of the optical fiber, and the guided light is optically converted by the light converting member to obtain emission light with changes made to desired irradiation pattern and color.

SUMMARY OF THE INVENTION

According to a first aspect of the present invention, there is provided a light source device comprising:
a first excitation light source configured to emit a first excitation light having a first wavelength range;
a second excitation light source configured to emit a second excitation light having a second wavelength range, wherein at least a portion of the second wavelength range is different from the first wavelength range;
a wavelength converting unit comprising:
a first wavelength converting member configured to wavelength convert the first excitation light by absorbing the first excitation light and emitting a first wavelength-converted light; and
a second wavelength converting member configured to wavelength convert the second excitation light by absorbing the second excitation light and emitting a second wavelength-converted light,
wherein the first excitation light source and the second excitation light source are configured to be able to set a light intensity of the first excitation light and a light intensity of the second excitation light independently, and to emit the first excitation light and the second excitation light at the same time,
wherein the wavelength converting unit is configured to emit a first emission light having a first spectral shape when the first wavelength converting member and the second wavelength converting member are irradiated with the first excitation light, and
emit a second emission light having a second spectral shape when the first wavelength converting member and the second wavelength converting member are irradiated with the second excitation light, wherein the first spectral shape is different from the second spectral shape, and
wherein at least a portion of the first wavelength converting member and at least a portion of the second wavelength converting members are arranged within an irradiation space that is commonly irradiated by both the first excitation light and the second excitation light.

DESCRIPTION OF THE PREFERRED EMBODIMENTS

Embodiments of the present invention will be described below with reference to the accompanying drawings.

First Embodiment

Figure 1:
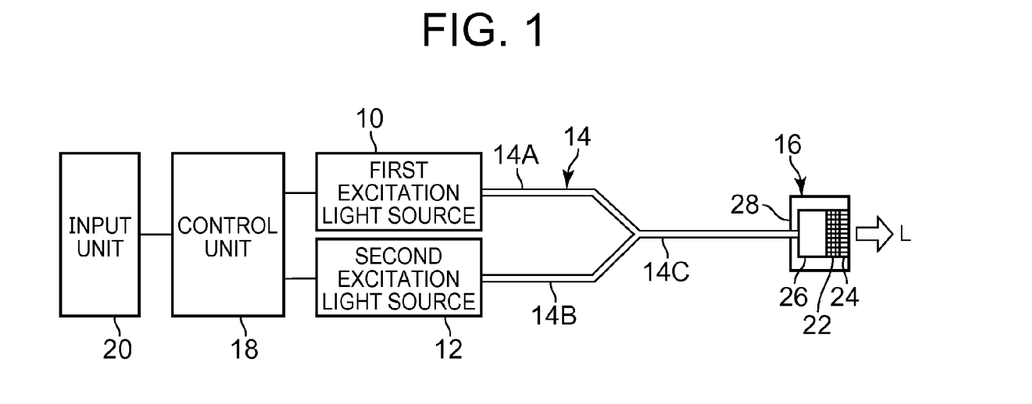
FIG. 1 is a diagram showing the structure of a light source device according to a first embodiment of the present invention.

The structure of a light source device according to a first embodiment of the present invention will first be described.
As shown in FIG. 1, the light source device according to the embodiment is made up of a first excitation light source 10, a second excitation light source 12, an optical coupler 14, a wavelength converting unit 16, a control unit 18, and an input unit 20. The first excitation light source 10 emits a first excitation light having a first excitation light wavelength range. The second excitation light source 12 emits a second excitation light having a second excitation light wavelength range different from the first excitation light wavelength range. The optical coupler 14 combines the first and second excitation light from the first and second excitation light sources 10 and 12. The wavelength converting unit 16 receives the first and second excitation light emitted from the optical coupler 14, converts the first excitation light to a first emission light different from the first excitation light wavelength range and converts the second excitation light to a second emission light wavelength range different from the second excitation light wavelength range, and emits emission light including the first emission light and the second emission light. The emission light from the wavelength converting unit 16, i.e. emission light of the light source device is irradiated as illumination light L to an illuminated object, not shown. The control unit 18 controls the first excitation light source 10 and the second excitation light source 12 to adjust the excitation light intensity ratio between the first excitation light source 10 and the second excitation light source 12 to make a spectrum adjustment of the illumination light L. The input unit 20 is used to enter information on the spectrum of illumination light to be targeted. As used in the present disclosure, "light intensity ratio" is defined as a ratio of light intensities of the two wavelength components that is obtained by the decomposition of the light. As used in the present disclosure, "spectrum" is defined as distribution of the intensity of each wavelength component that is obtained by the decomposition of the light. As used in the present disclosure, "spectrum adjustment" is defined as to adjust spectrum by changing at least one wavelength component that is obtained by the decomposition of the light.

The first excitation light source 10 can be but is not limited to a semiconductor light source for emitting excitation light in a wavelength range of visible light. An example of the semiconductor light source of the first excitation light source 10 is a blue laser diode (hereinafter abbreviated as LD) with a wavelength of 450 nm. The second excitation light source 12 can be but is not limited to a semiconductor light source for emitting the second excitation light having the second excitation light wavelength range, with the second excitation light wavelength range being shorter than the first excitation light wavelength range. An example of the semiconductor light of the second excitation light source 12 is a near ultraviolet LD with a wavelength of 400 nm. As used in the present disclosure, "the second excitation light wavelength range being shorter than the first excitation light wavelength range" means a wavelength corresponding to a peak intensity of the second wavelength range is shorter than a wavelength corresponding to a peak intensity of the first wavelength range.

The optical coupler 14 is an optical coupling element having first and second incident ends optically connected to the first and second excitation light sources 10 and 12, respectively, and one emitting end optically connected to the wavelength converting unit 16. Specifically, the optical coupler 14 includes a first optical fiber 14A for guiding excitation light emitted from the first excitation light source 10, a second optical fiber 14B for guiding excitation light emitted from the second excitation light source 12, and a third optical fiber 14C for combining the light guide paths of the first and second optical fibers 14A and 14B into one path to guide light to the wavelength converting unit 16. Therefore, the emitting end of the optical coupler 14 in the embodiment is the emitting end of the third optical fiber 14C optically connected to the wavelength converting unit 16.

The wavelength converting unit 16 is made up of a first phosphor 22, a second phosphor 24, a light-transmitting member 26, and a holder 28, which are arranged, as shown in FIG. 1, in an emitting direction of excitation light emitted from the emitting end of the optical coupler 14. The holder 28 holds the first and second phosphors 22, 24, and the light-transmitting member 26.

The first and second phosphors 22 and 24 have fluorescence spectral characteristics and excitation light absorbing characteristics different from each other. As used in the present disclosure, "fluorescence spectral characteristics" is defined as a spectral properties which is emitting fluorescence when a phosphor absorb an excitation light and is measured with a fixed wavelength of the an excitation light. As used in the present disclosure "excitation light absorbing characteristics" is defined as a spectral properties which is absorbed by a phosphor and is measured with a fixed wavelength of the fluorescence and a varying wavelength of the excitation light.

At least a portion of the first phosphor 22 and at least a portion of the second phosphor 24 are arranged within an irradiation space that is commonly irradiated by both the first excitation light and the second excitation light. Specifically, the two phosphors 22 and 24 both have a cylindrical shape, and the first phosphor 22 and the second phosphor 24 are laminated in this order from the emitting end side of the optical coupler 14 inside the wavelength converting unit 16. Thus, the first and second excitation lights in two wavelength ranges incident into the wavelength converting unit 16 are first irradiated to the first phosphor 22, and the remaining portion of excitation light transmitted through the first phosphor 22 without being absorbed is irradiated to the second phosphor 24.

The first and second phosphors 22 and 24 in the first embodiment have the following optical properties.

The first phosphor 22 has the properties of absorbing and wavelength-converting the first excitation light, and of absorbing and transmitting or scattering the second excitation light with little wavelength conversion, which is a first wavelength converting member for emitting first wavelength-converted light when absorbing the first excitation light. On the other hand, the second phosphor 24 has the properties of absorbing and wavelength-converting the second excitation light, and of absorbing, transmitting or scattering the first excitation light with little wavelength conversion, which is a second wavelength converting member for emitting second wavelength-converted light when absorbing the second excitation light. It is preferred that these first phosphor 22 and second phosphor 24 should be combined to produce white light. An example of the first phosphor 22 is $Y_3Al_5O_{12}$:Ce (yellow, hereinafter abbreviated as YAG), and an example of the second phosphor 24 is $(Sr,Ca,Ba,Mg)_{10}(PO_4)_6Cl_2$:Eu (blue, hereinafter abbreviated as SCA).

Figure 2A:
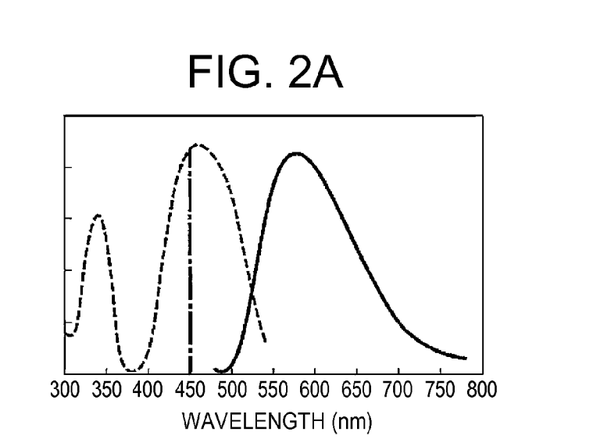
FIG. 2A is a graph showing the excitation/fluorescence spectral characteristics of a first phosphor (YAG).

FIG. 2A is a graph showing the excitation/fluorescence spectral characteristics of the first phosphor 22 (YAG). In FIG. 2A, the excitation spectrum is indicated by the broken line and the fluorescence spectrum is indicated by the solid line, respectively. The fluorescence spectrum of the first phosphor 22 (YAG) has a broad spectrum near an emission peak of 570 nm, having a half-value width of about 130 nm and emitting light in yellow. The excitation spectrum shows the properties of absorbing blue excitation light (first excitation light) near 450 nm well and emitting light strongly, but hardly emitting light with near-ultraviolet excitation light (second excitation light) near 400 nm.

Figure 2B:
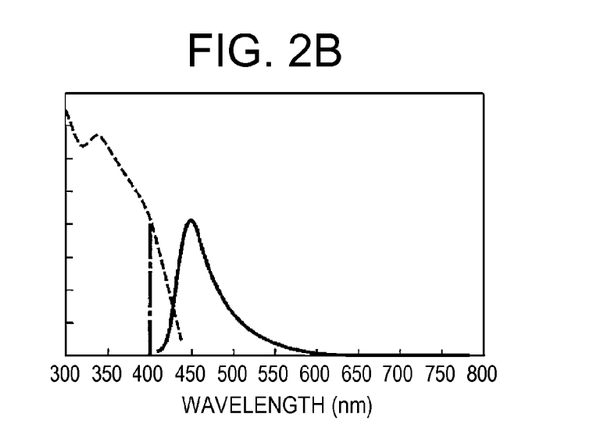
FIG. 2B is a graph showing the excitation/fluorescence spectral characteristics of a second phosphor (SCA).

FIG. 2B is a graph showing the excitation/fluorescence spectral characteristics of the second phosphor 24 (SCA). In FIG. 2B, the excitation spectrum is indicated by the broken line and the fluorescence spectrum is indicated by the solid line, respectively. The fluorescence spectrum of the second phosphor 24 (SCA) has a broad spectrum near an emission peak of 450 nm, having a half-value width of about 60 nm and exhibiting blue. Therefore, the second wavelength-converted light emitted from the second phosphor 24 (SCA) contains the first excitation light. The excitation spectrum shows the properties of hardly emitting light with blue excitation light (first excitation light) near the wavelength of 450 nm but emitting fluorescence well as the wavelength approaches a shorter wavelength from the near-ultraviolet excitation light (second excitation light) to ultraviolet excitation light.

The spectral shape of the first emission light emitted from the wavelength converting unit 16 when the first excitation light is irradiated to the first phosphor 22 (YAG) and the second phosphor 24 (SCA) contains a spectrum as indicated by the solid line in FIG. 2A (and the spectrum of the first excitation light transmitted without wavelength conversion by the first phosphor 22 (YAG) and the second phosphor 24 (SCA)).

The spectral shape of the second emission light emitted from the wavelength converting unit 16 when the second excitation light is irradiated to the first phosphor 22 (YAG) and the second phosphor 24 (SCA) contains a spectrum as indicated by the solid line in FIG. 2B (and the spectrum of the second excitation light transmitted without wavelength conversion by the first phosphor 22 (YAG) and the second phosphor 24 (SCA)). Thus, the spectral shape of the first emission light emitted when the first excitation light is irradiated is different from the spectral shape of the second emission light emitted when the second excitation light is irradiated. Since the emission light from the wavelength converting unit 16, i.e. the emission light (illumination light L) of the light source device contains these first and second emission lights, spectral components continuously exist in a wavelength range of 405 nm to 700 nm.

In a modification of the first embodiment, the first phosphor 22 may be terbium aluminum garnet (TAG):Ce (yellow) or lutetium aluminum garnet (LAG):Ce (green, hereinafter abbreviated as LAG), and the second phosphor 24 may be $BaMgAl_{10}O_{17}$:Eu (BAM:Eu) (blue, hereinafter abbreviated as BAM).

The light-transmitting member 26 has the property of transmitting four kinds of light, namely the first/second excitation light emitted from the emitting end of the optical coupler 14 and two fluorescences emitted from the first and second phosphors 22 and 24. The light-transmitting member 26 is placed between the emitting end of the optical coupler 14 and the first and second phosphors 22 and 24, and has a cylindrical shape with a first face (and a second face parallel to the first face) that is almost the same size as the face of the cylinder-shaped first and second phosphors 22 and 24. Therefore, a shape obtained by combining the light-transmitting member 26 and the first and second phosphors 22 and 24 is also cylindrical.

The holder 28 is formed in a predetermined cylindrical shape. The holder 28 has an incident opening as an incidence part for allowing the first and second excitation lights emitted from the emitting end of the optical coupler 14 enter the first and second phosphors 22 and 24. The holder 28 also has an emitting opening as an emission part for emitting the first and second emission lights, where the first and second emission lights contain fluorescences wavelength-converted by the first and second phosphors 22, 24 and excitation lights transmitted through or scattered from the phosphors 22 and 24. Then, the holder 28 holds the first and second phosphors 22 and 24 in the irradiation space that is commonly irradiated by both the first excitation light and the second excitation light. The holder 28 further defines a through hole that continues from the incident opening to the emitting opening, and a reflection member is formed on the inner surface of the holder 28. The fluorescences generated by the first and second phosphors 22, 24 and emitted in directions other than the forward direction of the emitting surface of the wavelength converting unit 16 are reflected by this reflection member and guided to the front of the emitting surface of the wavelength converting unit 16 efficiently.

In regard to the alignment order of the first phosphor 22 and the second phosphor 24 inside the wavelength converting unit 16, it is preferred that a phosphor having excitation/fluorescence spectral characteristics on a short wavelength side (the second phosphor 24 in this case) be arranged on the emitting opening side of the holder 28. This is because such an alignment reduces the rate of absorbing fluorescence generated by the second phosphor 24 into the first phosphor 22.

Figure 3:
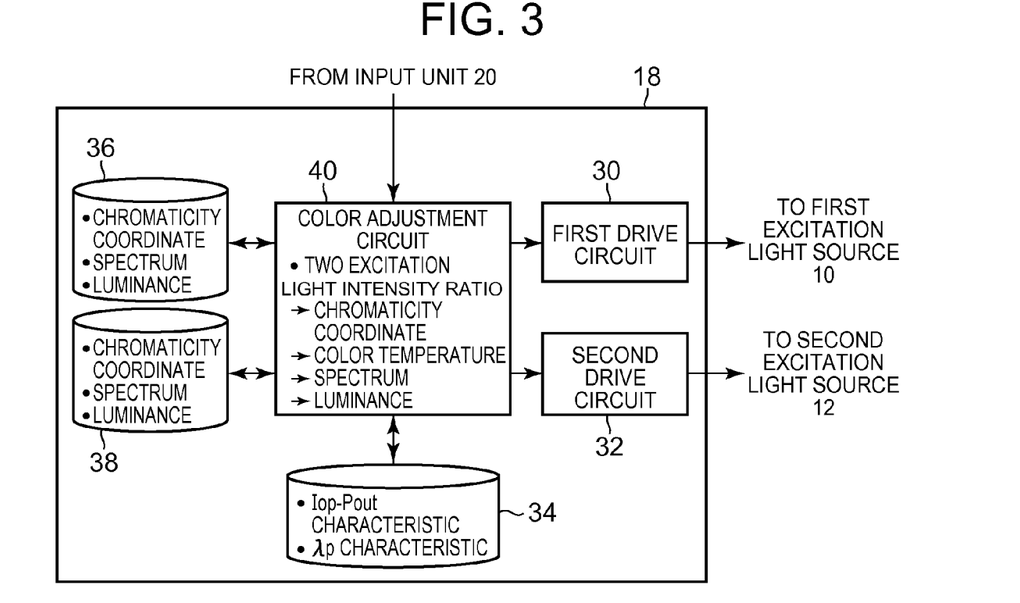
FIG. 3 is a block diagram showing the structure of a control unit.

As shown in FIG. 3, the control unit 18 is made up of a first drive circuit 30, a second drive circuit 32, an excitation light source basic information database (hereinafter abbreviated as DB) 34, a first excitation light source-based characteristic information database DB 36, a second excitation light source-based characteristic information database DB 38, and a color adjustment circuit 40.

Here, the first and second drive circuits 30 and 32 are circuits for driving the first and second excitation light sources 10 and 12, respectively. These first and second drive circuits 30 and 32 can independently adjust the light intensity of the first and second excitation lights emitted from the two excitation light sources 10 and 12, respectively. These first and second drive circuits 30 and 32 perform continuous driving or pulse driving of the excitation light sources 10 and 12, respectively. In other words, the first and second drive circuits 30 and 32 are configured to drive the two excitation light sources 10 and 12 to emit light at the same time, or either one of the light sources can be turned on with the other turned off. The present invention is based on the case where the excitation light sources 10 and 12 emit light at the same time. However, since there is a case where it is optimum that either one of the light sources is turned on with the other turned off, the present invention is configured to allow such an emission mode.

The excitation light source basic information DB 34 is a database for storing characteristic information (peak wavelength, Iop-Pout characteristic) on the first and second excitation light sources 10 and 12.

The characteristic information DBs 36 and 38 based on the first and second excitation light sources are databases, each of which stores characteristic information on illumination light produced by single wavelength excitation of each corresponding excitation light. Specifically, when excitation light having a predetermined intensity is incident on the first and second phosphors 22 and 24 from only the first excitation light source 10 or only the second excitation light source 12, color information such as the spectrum of, light intensity of, and chromaticity coordinate information on the first or second emission light emitted from the wavelength converting unit 16 is stored. The color information is parameters unique to emission light, such as the spectrum, chromaticity coordinates, and light intensity of the emission light. The color information is set respectively for the first emission light emitted from the first and second phosphors 22 and 24 when only the first excitation light is irradiated or for the second emission light emitted from the first and second phosphors 22 and 24 when only the second excitation light is irradiated.

The color adjustment circuit 40 calculates a light intensity ratio between the first and second excitation lights necessary to set the color information to desired values, such as the spectrum, light intensity, and chromaticity coordinates of the emission light emitted from the wavelength converting unit 16, i.e. of the illumination light L. The calculation of this light intensity ratio is made based on the color information on the first emission light stored in the first excitation light source-based characteristic information database DB 36 and the color information on the second emission light stored in the second excitation light source-based characteristic information database DB 38. Further, the color adjustment circuit 40 sets conditions for the two drive circuits 30 and 32 to drive the excitation light sources 10 and 12 to emit the excitation light with light intensity according to the light intensity ratio calculated. Thus, the color adjustment circuit 40 functions as a spectrum control unit for calculating the light intensity ratio between the first and second excitation lights necessary to set, to desired values, the color information on the emission light emitted from the wavelength converting unit 16, i.e. on the illumination light L from the relationship between the color information on the first emission light and the color information on the second emission light to control the light intensity of the first and second excitation lights based on the calculated light intensity ratio. This enables the first and second excitation light sources 10 and 12 to set the light intensity independently and emit light at the same time.

The light intensity ratio shown here includes a case of the intensity ratio between the excitation lights continuously emitted from the first excitation light source 10 and the second excitation light source 12, and a case where a light intensity ratio within a predetermined period is set by changing the ratio of driving periods with a fixed excitation light intensity.

The input unit 20 is used to enter, to the color adjustment circuit 40, desired values for the color information, such as the spectrum, light intensity, and chromaticity coordinates of emission light emitted from the wavelength converting unit 16, i.e. of the illumination light L. The input unit 20 can include, but is not limited to, one or more of a keyboard, mouse, touch screen, and other devices. The input unit 20 enables a user to set and enter the desired values while observing an image of the illuminated object illuminated by the illumination light L and taken with an imager. When the desired values are set to values that make the emission light, i.e. the illumination light L become predetermined white light, the input unit 20 may be configured to receive an output of white balance adjustment from the imager so that the values can be automatically set and entered to the color adjustment circuit 40, or a value unique to the predetermined white light may be given to the color adjustment circuit 40 in advance so that the input unit 20 can be omitted.

Next, the operation of the light source device according to the embodiment will be described.

For example, when the color of desired illumination light is instructed from the user through the input unit 20, the control unit 18 adjusts the excitation light intensity ratio between the first excitation light source 10 and the second excitation light source 12 to emit light in a desired color. The color adjustment operation performed by the control unit 18 will be described below with reference to FIG. 4.

Figure 4:
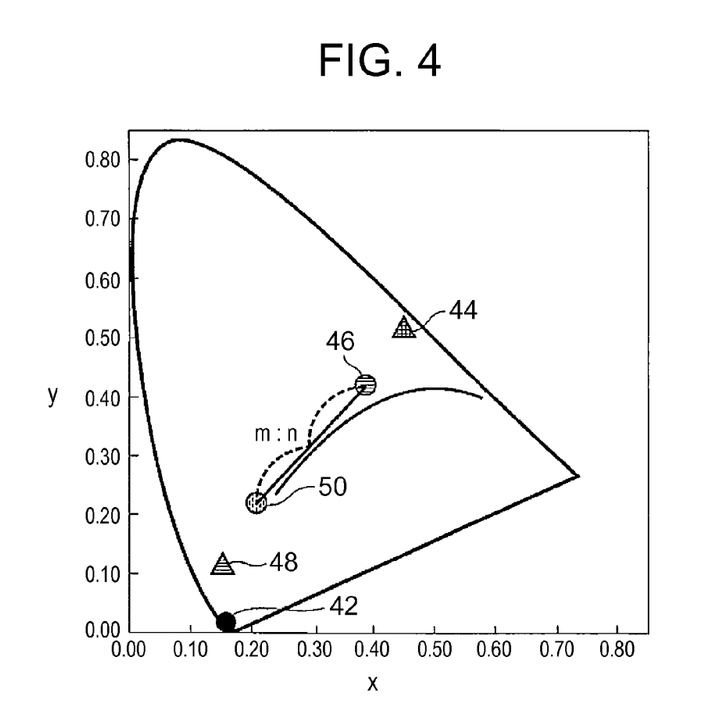
FIG. 4 is a chromaticity diagram for describing a color adjustment operation by two-wavelength range excitation light.

On the chromaticity diagram of FIG. 4, since the first excitation light (blue LD light) from the first excitation light source 10 almost overlaps the second excitation light as near-ultraviolet LD light from the second excitation light source 12, the chromaticities are shown as one chromaticity 42 for the first and second excitation light sources.

When only the blue LD light of the first excitation light source 10 is irradiated to the wavelength converting unit 16, the blue LD light is partially absorbed by the first phosphor 22 (YAG) and wavelength-converted to yellow fluorescence (chromaticity 44 of the first phosphor). At this time, since the second phosphor 24 (SCA) hardly performs wavelength conversion with the blue LD light, the chromaticity coordinates of the first emission light at the time of driving the first excitation light source 10 becomes chromaticity coordinates (chromaticity 46 by the first excitation light source) determined by the percentage of the light intensity of yellow fluorescence and the light intensity of blue LD light transmitted. Chromaticity coordinate data 44 and 46 has stored in the first excitation light source-based characteristic information DB 36 of the control unit 18.

When only the near-ultraviolet LD light of the second excitation light source 12 is irradiated to the wavelength converting unit 16, the near-ultraviolet LD light is hardly absorbed by the first phosphor 22 (YAG), but partially absorbed by the second phosphor 24 (SCA) and wavelength-converted to blue fluorescence (chromaticity 48 of the second phosphor). Further, since the blue fluorescence generated by the second phosphor 24 is isotropically emitted, part of this blue fluorescence enters the first phosphor 22 (YAG) and is reabsorbed thereby to generate a small intensity of yellow fluorescence. Therefore, the chromaticity coordinates of the second emission light at the time of driving the second excitation light source 12 becomes chromaticity coordinates (chromaticity 50 by the second excitation light source) obtained by shifting from the coordinates of the second phosphor 24 (SCA) to the coordinate side of the first phosphor 22 (YAG) to a small extent. The chromaticity coordinate data at this time is stored in the second excitation light source-based characteristic information DB 38 of the control unit 18.

Then, according to the excitation light intensity ratio (m:n) between the first excitation light from the first excitation light source 10 and the second excitation light from the second excitation light source 12, a straight line connecting the two chromaticity coordinates (chromaticity 46 and chromaticity 50 by the first and second excitation light sources) is a range in which the color adjustment circuit 40 is capable of adjusting the chromaticities of the illumination light. The light intensity ratio of the two excitation lights to produce desired color is calculated by the color adjustment circuit 40, and required intensity of excitation lights are emitted from the excitation light sources 10 and 12 to the wavelength converting unit 16, respectively, to provide the illumination light L from the light source device.

Figure 5:
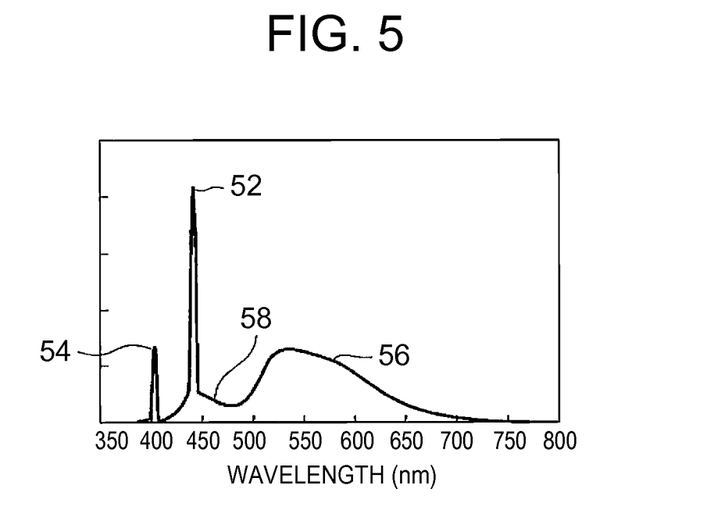
FIG. 5 is a graph showing an example of the spectrum of white light (about 5500 Kelvin) produced as illumination light by adjusting the two-wavelength excitation light intensity ratio.

FIG. 5 is a graph showing an example of a spectrum that produces white light (about 5,500 K) as the illumination light L obtained by adjusting the two-wavelength range excitation light intensity ratio. The white light has a spectrum in a continuous wavelength range of 410 nm to 700 nm by a combination of the two-wavelength excitation light components (first excitation light 52 and second excitation light 54) and two-wavelength range fluorescence components (first phosphor (YAG) 56 and second phosphor (SCA) 58).

Figure 6:
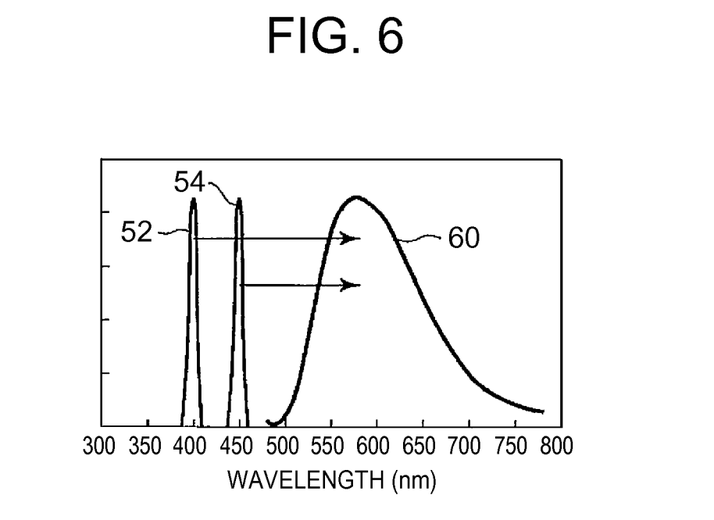
FIG. 6 is a graph showing a difference between excitation wavelengths for exciting the phosphors.

FIG. 6 is a graph showing a difference between excitation wavelengths for exciting the phosphors. The phosphors 22 and 24 in the embodiment are different in terms of the fluorescence wavelength and the excitation light absorption wavelength, and adapted to absorb light on a wavelength side shorter than the fluorescence wavelength. At the time of wavelength conversion of the phosphors, a wavelength conversion loss (heat generation) occurs due to an energy difference between the wavelength of absorbed light and the wavelength of fluorescence. In the case of FIG. 6, since the second excitation light 54 is closer to the wavelength of fluorescence 60 than the first excitation light 52, the wavelength conversion loss caused by the second excitation light 54 becomes smaller. Therefore, it is preferred to select an excitation wavelength closer to the fluorescence wavelength.

The color adjustment circuit 40 of the control unit 18 can not only control the first and second drive circuits 30 and 32 to drive the first excitation light source 10 and the second excitation light source 12 to generate emission light, i.e. the illumination light L as a mixture at a mixing ratio between the first emission light and the second emission light according to the excitation light intensity ratio between excitation lights from the first excitation light source 10 and the second excitation light source 12, but also make the excitation light intensity ratio between the excitation lights from the first excitation light source 10 and the second excitation light source 12 variable with time, where the first excitation light source 10 and the second excitation light source 12 are driven at the same time, to perform time-varying control of the color information on the illumination light as the mixture at the mixing ratio between the first emission light and the second emission light.

Thus, the color adjustment circuit 40 can also function as a spectrum control unit for controlling the first and second drive circuits 30 and 32, respectively, to perform time-varying control of the color information on the emission light emitted from the wavelength converting unit 16 as the mixture at the mixing ratio between the first emission light and the second emission light, i.e. on the illumination light L.

As described above, in the light source device according to the first embodiment, since excitation lights in two wavelength ranges are irradiated to the phosphors 22 and 24 placed inside the common wavelength converting unit 16 while changing the excitation light intensity ratio between the excitation lights in the two wavelength ranges, a color adjustment of the emission light emitted from the wavelength converting unit 16, i.e. of the illumination light L can be achieved.

Further, white light in a broad spectrum can be provided by a predetermined combination of the phosphors 22, 24 and the excitation light intensity ratio.

Further, since the emission light, i.e. the illumination light L is emitted from one emitting end of the wavelength converting unit 16, the emission light can be obtained from the same light emitting point, and this can lead to obtaining emission light the color of which is adjusted not to generate any color unevenness.

In regard to the excitation light sources 10 and 12 to excite the two phosphors 22 and 24, excitation wavelength bands with small wavelength differences from the fluorescence spectrum wavelengths can be selected to reduce the energy difference between absorption and fluorescence. This can reduce the wavelength conversion loss, and hence provide emission light with high wavelength conversion efficiency.

Further, in regard to the excitation light sources 10 and 12 to excite the two phosphors 22 and 24, two excitation wavelength ranges to increase the quantum yield of each of the phosphors 22 and 24 can be selected to provide emission light with high wavelength conversion efficiency. As used in this specification, "quantum yield" is defined as the ratio of the number of photons emitted to the number of photons absorbed.

Modification of First Embodiment

Next, a modification of the light source device according to the first embodiment of the present invention will be described.

Figure 7:
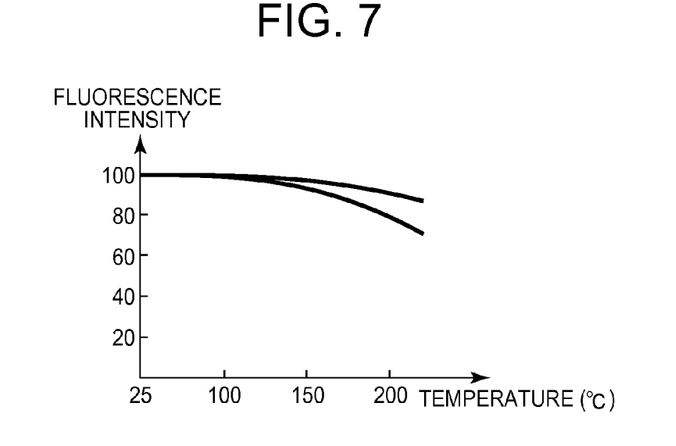
FIG. 7 is a graph showing the temperature quenching properties of the phosphors.

The first phosphor 22 as a first wavelength converting member and the second phosphor 24 as a second wavelength converting member have temperature quenching properties (efficiency is down as temperature rises) different from each other. As used in the present disclosure, "temperature quenching properties" is defined as a relationship of light emission efficiency decreasing as temperature of a phosphor increases. The first phosphor 22 (YAG) is more stable than the second phosphor 24 (SCA) in terms of the light emission efficiency even if the temperature rises. In other words, as shown in FIG. 7, the second phosphor 24 (SCA) has the property of reducing the wavelength conversion efficiency as the temperature rises (large temperature quenching).

Figure 8:
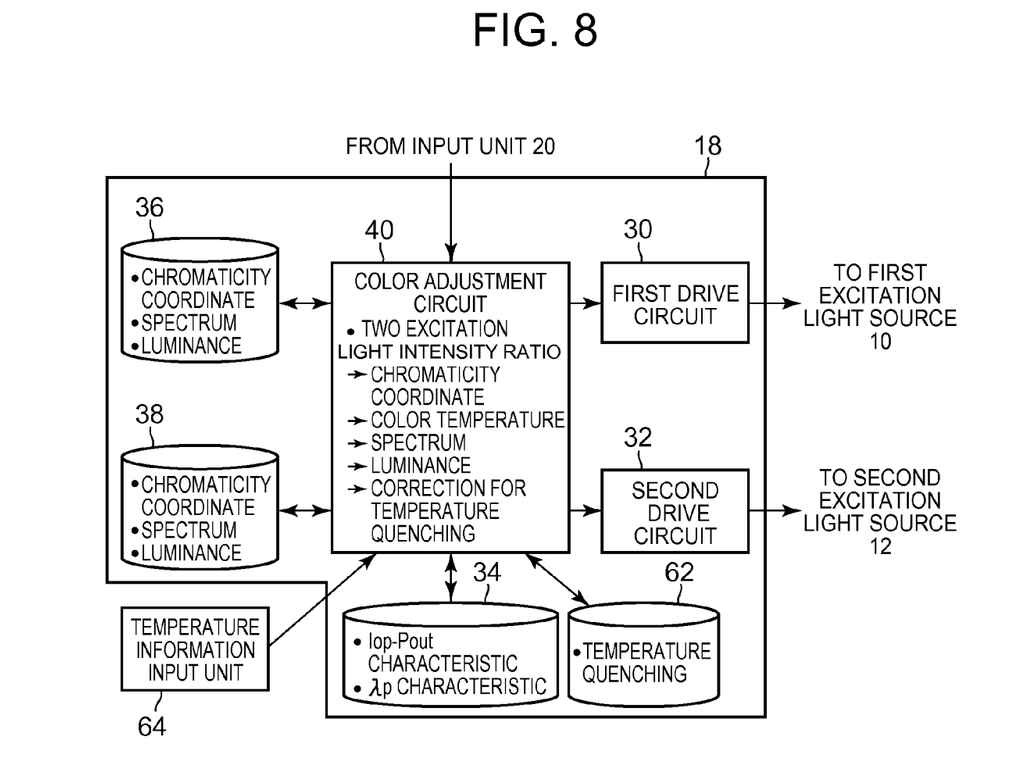
FIG. 8 is a block diagram showing the structure of a control unit of a light source device according to a modification of the first embodiment.

Therefore, in this modification, a phosphor information DB 62 for storing the temperature quenching properties of the first and second phosphors 22 and 24 is provided in the control unit 18, and the color adjustment circuit 40 of the control unit 18 further includes a temperature information input unit 64 used to enter temperature information on the phosphors 22 and 24 as shown in FIG. 8. Examples of the temperature information input unit 64 include, but are not limited to, one or more of a keyboard, a mouse, and a touch screen.

Based on information on temperature rises in the phosphors 22 and 24 from the temperature information input unit 64, and the temperature quenching properties of the phosphors 22 and 24 stored in the phosphor information DB 62, the color adjustment circuit 40 corrects the excitation light intensity ratio of the two excitation lights to provide desired color.

This correction operation may be performed only when the total light intensity of two excitation lights becomes larger than or equal to a prescribed value. This is because, for example, heat generation intensity are different between 10 mW and 100 mW even when the excitation light intensity ratio is 1:1 to make the luminescent colors different.

Thus, the color adjustment circuit 40 functions as a correction unit for making a correction based on the temperature quenching properties associated with heat generation in the first and second wavelength converting members due to the irradiation of the excitation light intensity.

The temperature information input unit 64 may also be used to enter tabulated information on the relationship between excitation light intensity and heat generation, rather than to enter information on the actually measured temperatures of the phosphors 22 and 24, so that the color adjustment circuit 40 will refer to the table to estimate the temperatures of the phosphors 22 and 24 from the excitation light intensity in order to perform the correction operation.

As described above, since the light source device according to the modification of the first embodiment considers the temperature quenching properties of the phosphors 22 and 24 to vary the light intensity ratio of two excitation lights even when it is desired to change the luminance of the illumination light from low to high while keeping the color of the illumination light, the color adjustment of the illumination light L can be achieved.

Second Embodiment

Next, a second embodiment of the present invention will be described.

Since the basic structure of the light source device according to the second embodiment is common to that of the light source device according to the first embodiment, only differences between the light source devices of the first and second embodiments will be described here.

In the second embodiment, it is assumed that the two kinds of phosphors 22 and 24 have the following optical properties.

The second phosphor 24 absorbs and wavelength-converts the second excitation light, and transmits the first excitation light almost entirely. The first phosphor 22 absorbs and wavelength-converts the first excitation light and the second excitation light. It is preferred to use a combination of the first phosphor 22 and the second phosphor 24 so that white light can be provided. An example of the first phosphor 22 is an Europium (Eu)-activated silicate phosphor (green to orange, hereinafter abbreviated as silicate). It may also be α-SiAlON:Eu (orange, hereinafter abbreviated as SiAlON). The second phosphor 24 is SCA like in the first embodiment, or it may be BAM.

Next, the operation of the light source device according to the second embodiment will be described. The operation is not basically different from the operation of the light source device according to the first embodiment. Here, only a point different from the first embodiment will be described.

Components of the excitation light emitted at the time of two wavelength range excitation by a combination of the phosphors 22 and 24 in the embodiment and the color adjustment are as follows.

Figure 9:
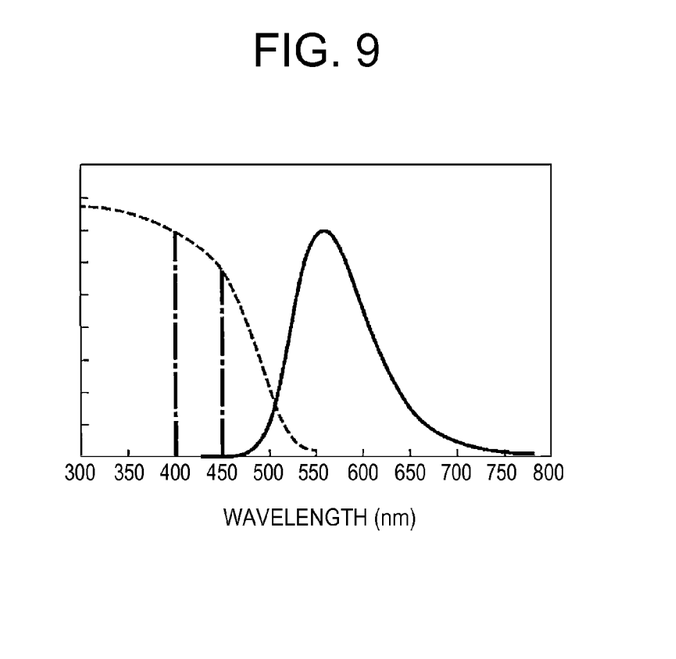
FIG. 9 is a graph showing the excitation/fluorescence spectral characteristics of a first phosphor (silicate) in a light source device according to a second embodiment of the present invention.

FIG. 9 is a graph showing the excitation/fluorescence spectral characteristics of the first phosphor 22 (silicate). In FIG. 9, the excitation spectrum is indicated by the broken line and the fluorescence spectrum is indicated by the solid line, respectively.

Upon excitation by the first excitation light at 450 nm, the first excitation light is partially absorbed by the first phosphor 22 (silicate) and converted to yellow fluorescence as shown by the solid line in FIG. 9. The chromaticity coordinates of the first emission light upon excitation at 450 nm is determined by the light intensity ratio between the yellow fluorescence emitted by the first phosphor 22 (silicate) and the transmitted excitation light at 450 nm.

Upon excitation by the second excitation light at 400 nm, the second excitation light is partially absorbed by the first phosphor 22 (silicate) and converted to yellow fluorescence, and further partially absorbed by the second phosphor 24 (SCA) and converted to blue fluorescence as shown in solid line in FIG. 2B. The chromaticity coordinates of the second emission light upon excitation at 400 nm is determined by the light intensity ratio between the yellow fluorescence emitted by the first phosphor 22 (silicate) and the blue fluorescence emitted by the second phosphor 24 (SCA).

The excitation light intensity ratio between 450 nm and 405 nm of each excitation light can be adjusted to provide white light including the transmitted light at 450 nm, the yellow fluorescence emitted at 450 nm, and the yellow fluorescence and blue fluorescence emitted at 405 nm.

As described above, in the light source device according to the second embodiment, when one phosphor wavelength-converts only one excitation light even if the other makes a wavelength conversion using both excitation light, an adjustment can be made with the two excitation light intensity ratio, thereby increasing the options of phosphors mountable in the wavelength converting unit 16.

Third Embodiment

Next, a third embodiment of the present invention will be described.

Since the basic structure of the light source device according to the third embodiment is common to that of the light source device according to the first embodiment, only differences between the light source devices of the first and third embodiments will be described below.

Figure 10:
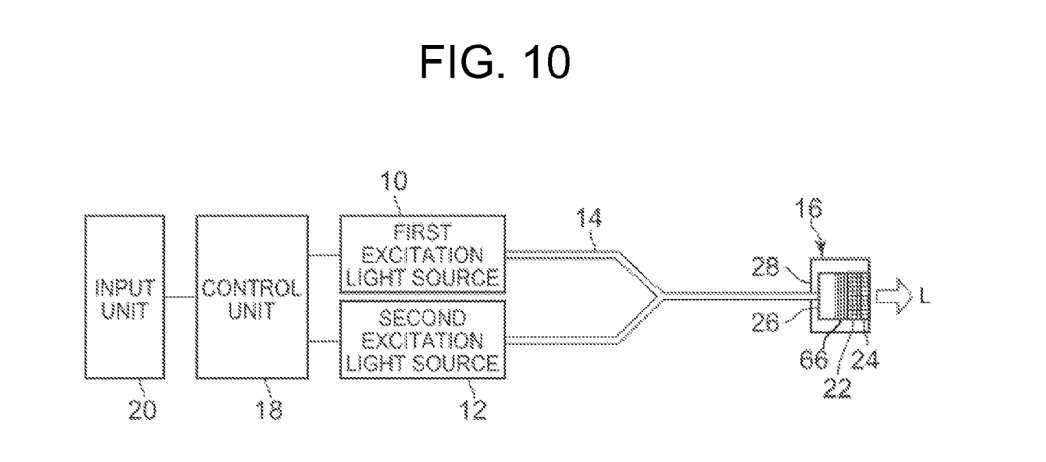
FIG. 10 is a diagram showing the structure of a light source device according to a third embodiment of the present invention.

In the third embodiment, the wavelength converting unit 16 as shown in FIG. 10 includes a third phosphor 66 in addition to the first and second phosphors 22 and 24. The third phosphor 66 is a third wavelength converting member for emitting third wavelength-converted light having a spectral shape different from those of the first and second wavelength-converted lights when absorbing at least either of the first and second excitation lights. Like the first and second phosphors 22 and 24, the third phosphor 66 is arranged within the irradiation space that is commonly irradiated by both the first excitation light and the second excitation light.

Here, the three phosphors 22, 24, and 66 have the following optical properties.

The first phosphor 22 absorbs and wavelength-converts the first excitation light, and transmits the second excitation light almost entirely. The second phosphor 24 absorbs and wavelength-converts the second excitation light, and transmits the first excitation light almost entirely. The third phosphor 66 absorbs and wavelength-converts the first excitation light and the second excitation light.

To improve the color rendering properties, a combination capable of providing white light using fluorescence components of the first to third phosphors 22, 24, and 66 is better than only using first, second phosphors 22, 24. Specifically, the first phosphor 22 is Lutetium Aluminum Garnet (LAG), but it may be YAG or TAG. The second phosphor 24 is SCA, but it may be BAM. The third phosphor 66 is $CaAlSiN_3$:Eu (CASN):Eu (red, hereinafter abbreviated as CASN), but it may be an active silicate phosphor with Eu (green, yellow, orange) or α-SiAlON:Eu (orange).

Next, the operation of the light source device according to the third embodiment will be described. The operation is not basically different from the operation of the light source device according to the first embodiment. Here, only a point different from the first embodiment will be described.

Components emitted at the time of two wavelength range excitation by a combination of the phosphors 22, 24, and 66 in the embodiment, and the color adjustment are as follows.

Figure 11:
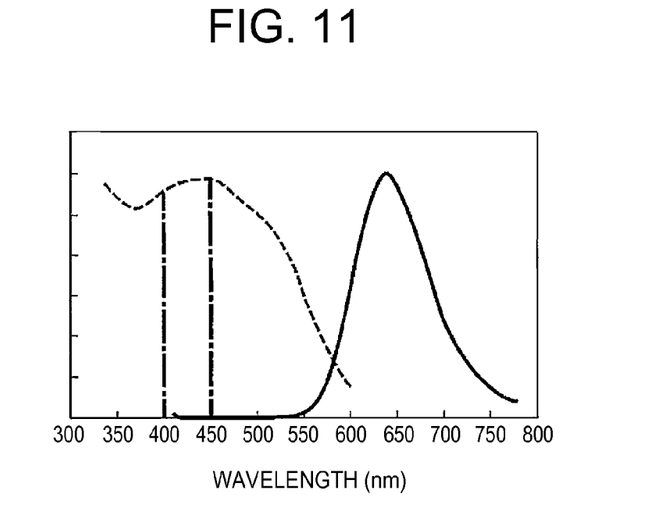
FIG. 11 is a graph showing the excitation/fluorescence spectral characteristics of a third phosphor (CASN).

FIG. 11 is a graph showing the excitation/fluorescence spectral characteristics of the third phosphor 66 (CASN). In FIG. 11, the excitation spectrum is indicated by the broken line and the fluorescence spectrum is indicated by the solid line, respectively.

Upon excitation by the first excitation light at 450 nm, the first excitation light is partially absorbed by the first phosphor 22 (LAG) and the third phosphor 66 (CASN), and wavelength-converted to respective fluorescence colors with part of the light transmitted therethrough. The chromaticity coordinates of the first emission light upon driving at 450 nm is determined by the light intensity ratio of the green and red fluorescences emitted by the first phosphor 22 (LAG) and the third phosphor 66 (CASN), and transmitted excitation light at 450 nm.

Upon excitation by the second excitation light at 400 nm, the second excitation light is partially absorbed by the third phosphor 66 (CASN) and the second phosphor 24 (SCA), and wavelength-converted to respective fluorescence colors with part of the light transmitted therethrough. The chromaticity coordinates of the second emission light upon driving at 400 nm is determined by the light intensity ratio between the red and blue fluorescences emitted by the third phosphor 66 (CASN) and the second phosphor 24 (SCA).

Figure 12:
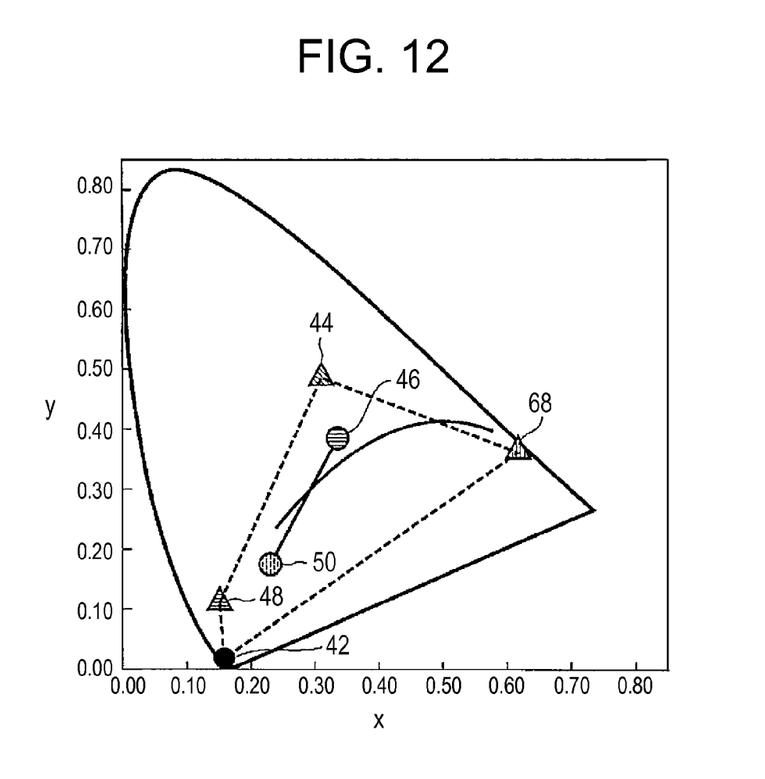
FIG. 12 is a chromaticity diagram for describing a color adjustment operation by two-wavelength excitation light.

FIG. 12 shows a color adjustment range on the chromaticity coordinates in the embodiment.

In the embodiment, the chromaticity coordinates (chromaticity 46 and chromaticity 50 by the first and second excitation light sources) of the first and second emission lights when the first and second excitation light sources 10 and 12 are driven, respectively, exist within a quadrangular range obtained by connecting the chromaticity 42 of the first and second excitation light sources, the chromaticity of the first phosphor 22 (LAG) (chromaticity 44 of the first phosphor), the chromaticity of the second phosphor 24 (SCA) (chromaticity 48 of the second phosphor), and the chromaticity of the third phosphor 66 (CASN) (chromaticity 68 of the third phosphor) with their chromaticity coordinates set as vertices.

Like in the first embodiment, a straight line connecting two points according to the two-wavelength excitation light intensity ratio is a range capable of making a color adjustment, and white light can be provided by a combination of a predetermined excitation light intensity ratio and phosphor conditions (the density and thickness of each phosphor).

As described above, in the light source device according to the third embodiment, phosphors capable of emitting blue, green, and red fluorescent lights are put together, and this can widen the spectral component range of the white light provided by two wavelength excitation and hence provide white light with color rendering properties higher than that in the first embodiment.

Fourth Embodiment

Next, a fourth embodiment of the present invention will be described.

Since the basic structure of the light source device according to the fourth embodiment is common to that of the first embodiment, only differences between the light source devices of the first and fourth embodiments will be described below.

Figure 13:
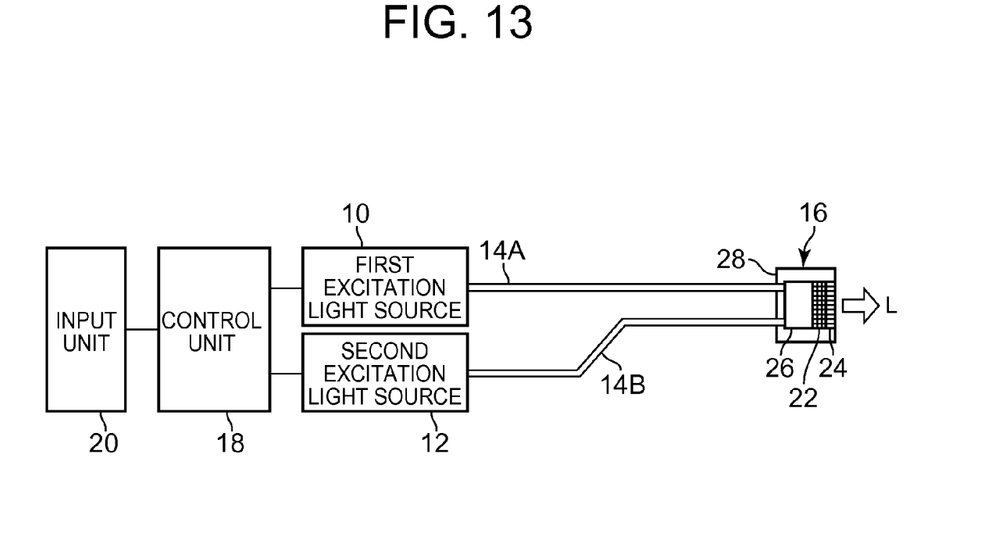
FIG. 13 is a diagram showing the structure of a light source device according to a fourth embodiment of the present invention.

In the fourth embodiment, as shown in FIG. 13, the light source device includes, instead of the optical coupler 14 of the first embodiment, a first optical fiber 14A for guiding light from the emitting end of the first excitation light source 10 to the wavelength converting unit 16, and a second optical fiber 14B for guiding light from the emitting end of the second excitation light source 12 to the wavelength converting unit 16.

The emitting ends of the first and second optical fibers 14A and 14B are placed at different positions of incident openings of the holder 28 in the wavelength converting unit 16, and the excitation lights from the first excitation light source 10 and the second excitation light source 12 are irradiated from the different positions. Note that the first and second phosphors 22 and 24 are arranged within an irradiation space that is commonly irradiated by excitation lights emitted from the first optical fiber 14A and the second optical fiber 14B, and light is emitted from one point of the emitting end of the wavelength converting unit 16 as emission light, i.e. illumination light L.

Since the operation of the light source device according to the fourth embodiment having such a structure is the same as the operation of the light source device according to the first embodiment, redundant description will be omitted.

As described above, in the light source device according to the fourth embodiment, there are equipped the first optical fiber 14A and the second optical fiber 14B for guiding excitation light respectively emitted from the excitation light sources, and this can reduce the loss of the intensity of excitation light guided to the wavelength converting unit 16.

Even in the modification of the first embodiment, and the second and third embodiments, the optical coupler 14 can, of course, be replaced by the first and second optical fibers 14A and 14B like in the fourth embodiment.

While the present invention has been described based on the embodiments, the present invention is not limited to the aforementioned embodiments, and various modifications and applications are of course possible within the scope of the present invention.

For example, the first and second phosphors 22 and 24, or the first to third phosphors 22, 24, and 66 are formed in a cylindrical shape having the same radius, respectively, and the holder 28 is formed in a cylindrical shape. However, these elements may be so constructed that the phosphors 22 and 24 or the phosphors 22, 24, and 66 will be put together to form the shape of a continuous truncated cone and the holder 28 will have a sloping surface fitted to the truncated cone.

Further, it is preferred that the alignment order of the first and second phosphors 22 and 24, or the first to third phosphors 22, 24, and 66 inside the holder 28 should be, but not limited to, the alignment order as shown.

What is claimed is:

1. A light source device comprising:
    a first excitation light source configured to emit a first excitation light having a first wavelength range;
    a second excitation light source configured to emit a second excitation light having a second wavelength range, wherein at least a portion of the second wavelength range is different from the first wavelength range;
    a wavelength converter comprising:
        a first wavelength converting member configured to wavelength convert the first excitation light by absorbing the first excitation light and emitting a first wavelength-converted light; and
        a second wavelength converting member configured to wavelength convert the second excitation light by absorbing the second excitation light and emitting a second wavelength-converted light; and
    a spectrum control circuit configured to:
        independently control the first excitation light source to set a light intensity of the first excitation light, that is emitted, to at least two different values, and independently control the second excitation light source to set a light intensity of the second excitation light, that is emitted, to at least two different values, to change a light intensity ratio between the first excitation light and the second excitation light; and
        control the first excitation light source and the second excitation light source to emit the first excitation light and the second excitation light, the light intensities of which have been set, together,
        wherein the wavelength converter is configured to emit a first emission light having a first spectral shape when the first wavelength converting member and the second wavelength converting member are irradiated with the first excitation light, and emit a second emission light having a second spectral shape when the first wavelength converting member and the second wavelength converting member are irradiated with the second excitation light, wherein the first spectral shape is different from the second spectral shape,
        wherein a mixing ratio between the first emission light and the second emission light relates to color information of illumination light comprising the first emission light and the second emission light, and wherein at least a portion of the first wavelength converting member and at least a portion of the second wavelength converting member are arranged within an irradiation space that is commonly irradiated by both the first excitation light and the second excitation light.

2. The light source device according to claim 1, wherein the spectrum control circuit is configured to set the light intensity of the first excitation light and the light intensity of the second excitation light based on a predetermined color information of the illumination light, a color information of the first emission light and a color information of the second emission light.

3. The light source device according to claim 2, wherein the spectrum control circuit is configured to:
calculate, based on the color information of the first emission light and the color information of the second emission light, a ratio of a light intensity of the first excitation light and a light intensity of the second excitation light for achieving emission of the illumination light having the predetermined color information; and
set the light intensity of the first excitation light and the light intensity of the second excitation light based on the ratio of the light intensity of the first excitation light and the light intensity of the second excitation light that is calculated.

4. The light source device according to claim 2, wherein the spectrum control circuit is configured to:
set the light intensity of the first excitation light and the light intensity of the second excitation light to set a predetermined light intensity ratio between the first excitation light and the second excitation light, and
control the first excitation light source and the second excitation light source according to the predetermined light intensity ratio such that the illumination light is a white light.

5. The light source device according to claim 2, wherein the first wavelength converting member has a first temperature quenching property associated with heat generation in the first wavelength converting member, and the second wavelength converting member has a second temperature quenching property associated with heat generation in the second wavelength converting member, the second temperature quenching property being different from the first temperature quenching property, and
wherein the spectrum control circuit is configured to correct the control of the first excitation light source and the second excitation light source based on the first temperature quenching property and the second temperature quenching property.

6. The light source device according to claim 2, further comprising:
a memory for storing the color information of the first emission light and the color information of the second emission light.

7. The light source device according to claim 2, wherein the illumination light has spectral components continuously existing in a wavelength range of 405 nm to 700 nm.

8. The light source device according to claim 1, wherein the wavelength converter further comprises:
a third wavelength converting member configured to wavelength convert at least one of the first excitation light and the second excitation light by absorbing the at least one of the first excitation light and the second excitation light and emitting a third wavelength-converted light,
wherein at least a portion of the third wavelength converting member is arranged within the irradiation space, and
wherein the wavelength converter is configured to emit a third emission light having a third spectral shape different from the first spectral shape and the second spectral shape when the first wavelength converting member, the second wavelength converting member, and the third wavelength converting member are irradiated with the at least one of the first excitation light and the second excitation light.

9. The light source device according to claim 8, wherein the first wavelength converting member has a first temperature quenching property associated with heat generation in the first wavelength converting member, and the second wavelength converting member has a second temperature quenching property associated with heat generation in the second wavelength converting member, the second temperature quenching property being different from the first temperature quenching property, and
wherein the spectrum control circuit is configured to correct the control of the first excitation light source and the second excitation light source based on the first temperature quenching property and the second temperature quenching property.

10. The light source device according to claim 1, wherein the spectrum control circuit is configured to control the first excitation light source and the second excitation light source to make the light intensity ratio between the first excitation light and the second excitation light variable with time.

11. The light source device according to claim 1, further comprising:
a holder configured to hold at least a part of the first wavelength converting member and at least a part of the second wavelength converting member in the irradiation space,
wherein the holder defines an incident part through which the first excitation light and the second excitation light are incident on the first wavelength converting member and the second converting member, and defines an emitting part through which the first emission light and the second emission light are emitted;
a first optical fiber configured to guide the first excitation light from the first excitation light source to the wavelength converter; and
a second optical fiber configured to guide the second excitation light from the second excitation light source to the wavelength converter,
wherein an emitting end of the first optical fiber and an emitting end of the second optical fiber are optically connected to the incident part of the holder.

12. The light source device according to claim 1, further comprising:
a holder configured to hold at least a part of the first wavelength converting member and at least a part of the second wavelength converting member in the irradiation space,
wherein the holder defines an incident opening through which the first excitation light and the second excitation light are incident on the first wavelength converting member and the second converting member, and defines an emitting opening through which the first emission light and the second emission light are emitted; and an optical coupler configured to couple the first excitation light and the second excitation light, wherein the optical coupler has a first incident end optically connected to the first excitation light source, a second incident end optically connected to the second excitation light source, and an emitting end optically connected to the incident opening of the holder.

13. The light source device according to claim 1, wherein the first wavelength range is in a wavelength range of visible light, wherein the at least a portion of the second wavelength range is shorter than the first wavelength range, and wherein the first emission light comprises the first excitation light.

14. The light source device according to claim 13, wherein the second wavelength converting member is configured to not substantially wavelength convert the first excitation light.

15. The light source device according to claim 13, wherein the first wavelength converting member is configured to not substantially wavelength convert the second excitation light.

16. The light source device according to claim 1, wherein the second wavelength converting member is arranged to be closer to the first excitation light source and the second excitation light source than the first wavelength converting member.

17. An endoscope comprising the light source device according to claim 1.

* * * * *